(12) United States Patent
Ali-Hackl et al.

(10) Patent No.: US 6,441,704 B1
(45) Date of Patent: Aug. 27, 2002

(54) SURFACE ACOUSTIC WAVE FILTER HAVING BALANCED CROSSTALK CAPACITANCES IN SYMMETRIC OPERATION

(75) Inventors: Markus Ali-Hackl, Germering; Stefan Freisleben, München; Thomas Johannes, deceased, late of München, by Sonja Heidi Johannes, legal representative; Thomas Baier, München; Ulrich Bauernschmitt, Garching; Ulrike Rösler, Erding, all of (DE)

(73) Assignee: Epcos AG, Munich (DE)

( * ) Notice: Subject to any disclaimer, the term of this patent is extended or adjusted under 35 U.S.C. 154(b) by 44 days.

(21) Appl. No.: 09/668,490

(22) Filed: Sep. 25, 2000

Related U.S. Application Data

(63) Continuation of application No. PCT/DE99/00843, filed on Mar. 22, 1999.

(51) Int. Cl.⁷ .................................................. H03H 9/64
(52) U.S. Cl. ..................... 333/193; 333/195; 310/313 B
(58) Field of Search .......................... 333/193–196; 310/313 R, 313 B, 313 C, 313 D

(56) References Cited

U.S. PATENT DOCUMENTS

| | | | | |
|---|---|---|---|---|
| 5,351,022 A | * | 9/1994 | Ruile et al. | 333/195 |
| 5,936,487 A | * | 8/1999 | Solal et al. | 333/193 |
| 5,990,762 A | * | 11/1999 | Nakamura et al. | 333/195 |
| 6,043,726 A | * | 3/2000 | Solal et al. | 333/195 |
| 6,104,260 A | * | 8/2000 | Yamada et al. | 333/196 X |
| 6,163,236 A | * | 12/2000 | Thomas | 333/196 X |
| 6,268,782 B1 | * | 7/2001 | Hartmann et al. | 333/195 X |

FOREIGN PATENT DOCUMENTS

| | | |
|---|---|---|
| DE | 39 42 148 A1 | 6/1991 |
| DE | 42 14 122 A1 | 11/1993 |
| EP | 0 772 293 A1 | 5/1997 |
| EP | 0 872 954 A1 | 10/1998 |
| GB | 1 427 226 | 3/1976 |

OTHER PUBLICATIONS

B. Wall et al; "Balanced Driver Transversely Coupled Waveguide Resonator Filters", *1996 IEEE Ultrasonics Symposium*; vol. 1, pp. 47–51, Nov., 1996.*

* cited by examiner

*Primary Examiner*—Justin P. Bettendorf
*Assistant Examiner*—Barbara Summons
(74) *Attorney, Agent, or Firm*—Laurence A. Greenberg; Werner H. Stemer; Gregory L. Mayback

(57) ABSTRACT

A surface acoustic wave filter having compensated capacitive and inductive crosstalk between adjacent IDT input and output transducers includes electromagnetically coupled transducers split into partial transducers. The routing of the partial transducer pads is modified such that the flux directions of the magnetic couplings between the adjacent partial transducers are oppositely directed so that the total induced magnetic flux is zero. The partial transducers are connected in series or in parallel such that, in the case of symmetric operation, the crosstalk capacitances between adjacent pads and transducer surfaces are balanced at the corresponding port.

22 Claims, 4 Drawing Sheets

SURFACE ACOUSTIC WAVE FILTER HAVING BALANCED CROSSTALK CAPACITANCES IN SYMMETRIC OPERATION

CROSS-REFERENCE TO RELATED APPLICATION

This is a continuation of copending International Application PCT/DE99/00843, filed Mar. 22, 1999, which designated the United States.

BACKGROUND OF THE INVENTION

Field of the Invention

The invention relates to a surface acoustic wave ("SAW") filter. The selectivity of a SAW filter is greatly impaired by electromagnetic crosstalk. Crosstalk is significantly caused by closely adjacent filter structures, particularly closely adjoining structures of interdigital input and output transducers and their power connection tracks, also called pads.

A conventional transducer and pad topology is shown diagrammatically in FIG. 1. Input and output transducers 1 and 2, for example of a Z-path filter, are shown with diagrammatically illustrated reflectors 3, 4. Electromagnetic crosstalk is caused by two mechanisms, namely, by capacitive crosstalk between closely adjacent pads 5 and 6—symbolized by an equivalent circuit capacitance "C" between the pads indicated by dashed lines, and, by inductive crosstalk—symbolized in FIG. 1 by magnetic field lines H that enclose adjacent current flow lines partly identified by an arrow.

Typically, both mechanisms, i.e., inductive and capacitive crosstalk, occur simultaneously. Their respective shares of electromagnetic crosstalk depend on the filter parameters, with inductive crosstalk becoming increasingly significant at high frequencies and low impedances.

Typical SAW filters, the selectivity of which is considerably impaired by electromagnetic crosstalk, are acoustically transversely coupled filters, e.g., symmetrically operated transverse-mode-coupled resonator filters (also called transversely coupled resonator ("TCR") filters) of the type described in "1996 IEEE Ultrasonics Symposium—47–51". According to FIG. 2 on page 48 of the Symposium document, the input or output transducers are split along their longitudinal direction, i.e., in the direction of the acoustic track, and the part or partial transducers obtained are electrically serially interconnected. As a result, the capacitive crosstalk between the split partial transducers and the transducer element directly adjoining in the adjacent acoustic track can be compensated. Such compensation requires symmetric operation by at least one filter port, i.e., at least at the input or output transducer. In such case, the crosstalk cancels due to the different polarity of the voltages applied and the equal amount of the equivalent capacitance. Disadvantageously, the impedance of the corresponding connections is increased to twice the initial value.

Other conventional filters that are impaired in their selectivity by electromagnetic crosstalk includes Z-path filters, which have become known from, for example, German Published, Non-Prosecuted Patent Application DE A-40 18 784. Such filters couple input and output transducers disposed on separate acoustic tracks to one another through correspondingly inclined reflectors. The document proposes an interconnection of two part or partial filters in the form of a half bridge in which electrical signals cancel and acoustic signals are constructively superimposed by a suitable additional phase shift. A significant disadvantage of these filters is that they require twice the space and have an extremely elaborate and complicated pad structure.

In the case of in-line filters, i.e., filters having input and output transducers disposed on a common acoustic track, the electromagnetic crosstalk is kept low by relatively large transducer spacing and the minimization of "hot", i.e., signal-conducting transducer, areas.

SUMMARY OF THE INVENTION

It is accordingly an object of the invention to provide a surface acoustic wave filter that overcomes the hereinafore-mentioned disadvantages of the heretofore-known devices of this general type and that has at least two electromagnetically coupled transducers for compensating filter capacitive crosstalk and that has a greatly improved selectivity in comparison with conventional filters without increasing the impedance of the filter.

With the foregoing and other objects in view, there is provided, in accordance with the invention, a surface acoustic wave filter that can be operated symmetrically, including electromagnetically coupled IDT transducers split into partial transducers, the IDT transducers having electrical connection pads and ports, the partial transducers connected in parallel, the partial transducers and the electrical connection pads disposed to make, in the case of symmetric operation, crosstalk capacitances between adjacent ones of the pads and the IDT transducers approximately equal in amount at a corresponding one of the ports and at voltages of opposite polarity for balancing the crosstalk capacitances.

The invention provides a SAW filter that can be operated symmetrically. The filter exhibits electromagnetically coupled IDT transducers on mutually adjacent acoustic tracks and the IDT transducers are split into partial transducers. The partial transducers are connected in parallel. The partial transducers and electrical connection pads are disposed such that, for symmetric operation, the crosstalk capacitances between adjacent pads and IDT transducers are present at the corresponding port at voltages of the same amount but are provided with different signs. Thus, they are balanced.

In an advantageous development of the invention, the interdigital transducers are split into partial transducers. The routing of their pads and power connection tracks are modified such that, in addition, the flux directions of the magnetic couplings between the partial transducers and the transducers of the adjacent acoustic track are oppositely directed so that the total induced magnetic flux is zero. As such, the two main causes of the crosstalk of the SAW filter are eliminated and the transfer characteristic is improved.

In accordance with another feature of the invention, the IDT transducers have input and output transducers and the input and output transducers are split into the partial transducers.

In accordance with a further feature of the invention, the input and output transducers are split into the partial transducers longitudinally to acoustic tracks of the filter.

In accordance with an added feature of the invention, the input and output transducers are split into the partial transducers parallel to acoustic tracks of the filter.

In accordance with an additional feature of the invention, the partial transducers of the input and output transducers are connected in parallel.

In accordance with yet another feature of the invention, the partial transducers of the input and output transducers are connected differently.

In accordance with yet a further feature of the invention, at least one of the partial transducers is connected in parallel and at least another one of the partial transducers is connected in series.

The polarity of the electric drive is transposed in one of the partial transducers by a modified routing of the pads. The desired acoustic operation of the filter is maintained in the configuration by mirroring the relevant partial transducer in parallel with the preferred direction of acoustic propagation, i.e., by mirroring at its longitudinal axis.

In accordance with yet an added feature of the invention, one of two of the partial transducers is mirrored parallel to a direction of acoustic propagation.

The transposition of the polarity of the electrical drive can also be achieved if a partial transducer is displaced by an odd-numbered multiple of the half wavelength of the surface acoustic wave with respect to the other partial transducer.

In accordance with yet an additional feature of the invention, one of the partial transducers of one of the IDT transducers is displaced with respect to another one of the partial transducers of the one of the IDT transducers by an odd-numbered multiple of a half wavelength of a surface acoustic wave.

In accordance with again another feature of the invention, the IDT transducers have input and output transducers and the input and output transducers are split into the partial transducers at least one of transversely and in a direction transverse to an acoustic track.

In accordance with again a further feature of the invention, the partial transducers are connected in parallel.

In accordance with a concomitant feature of the invention, a pad of the pads routing in one of two of the partial transducers is selected to transpose a polarity of an electrical drive.

Other features that are considered as characteristic for the invention are set forth in the appended claims.

Although the invention is illustrated and described herein as embodied in a surface acoustic wave filter, it is, nevertheless, not intended to be limited to the details shown since various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
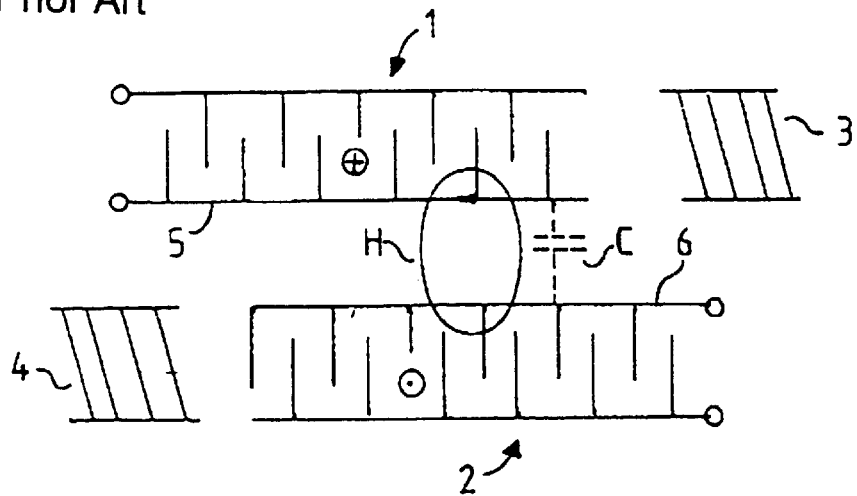
FIG. 1 is a schematic circuit diagram of a prior art surface acoustic wave filter.

In all the figures of the drawing, sub-features and integral parts that correspond to one another bear the same reference symbol in each case.

Figure 2:
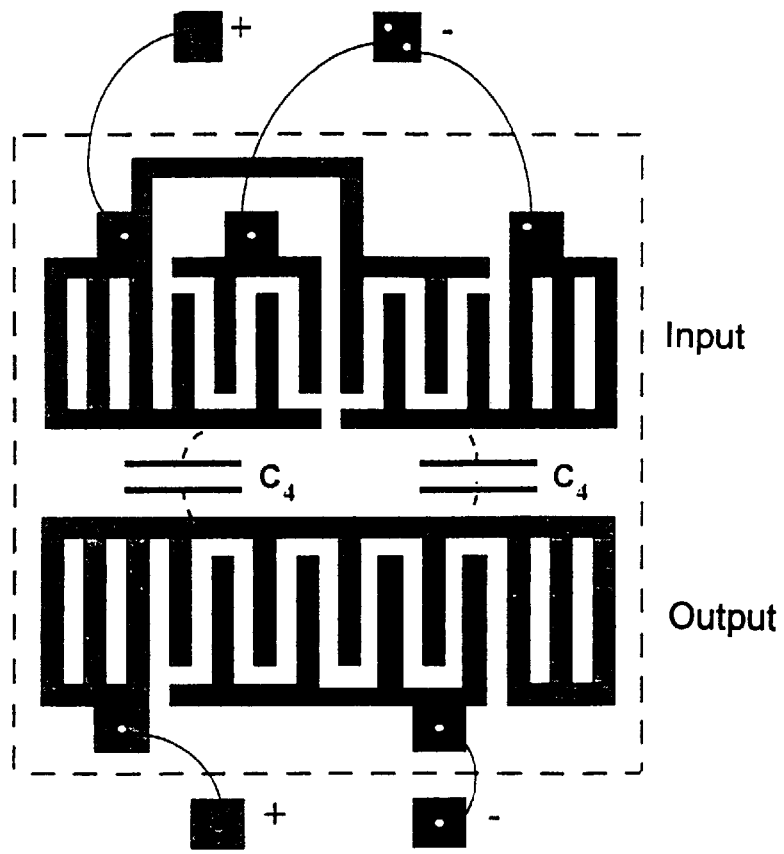
FIG. 2 is a schematic circuit diagram of a two-track SAW filter that is capacitively decoupled according to the invention.

Referring now to the figures of the drawings in detail and first, particularly to FIG. 2 thereof, there is shown a transducer, for example, an input transducer, that is longitudinally split but the partial transducers are not interconnected in series. Rather, they are interconnected in parallel. The crossing of the conductor tracks occurring in the configuration is resolved by double bonding to the casing. In the case of symmetric operation at the filter input—both a positive signal and a negative signal are applied—the two equivalent capacitances C4 and C4', which have approximately the same size and compensate each other due to the different polarities, are built up between the power rails of the partial transducers a and a' and the power rail 6 of the single transducer of the adjacent acoustic track. In contrast to prior art serial interconnections in partial transducers, the input impedance is retained at a reference value $Z_w$ by parallel interconnection of two partial transducers having a respective impedance of $2 Z_w$. Thus, the partial transducers do not increase the impedance at the filter input. The compensation of the capacitances C4 and C4' is also retained if the output is not operated symmetrically, i.e., if one terminal is connected to a fixed potential (ground).

Figure 3:
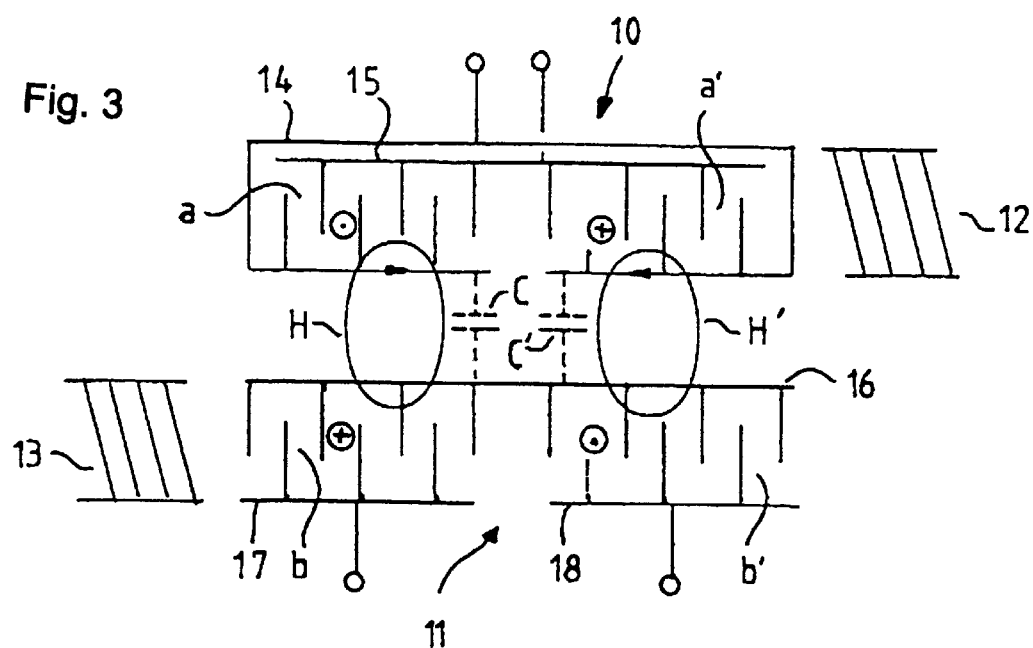
FIG. 3 is a schematic circuit diagram of a Z-path SAW filter that is capacitively and inductively decoupled according to the invention.

In the illustrative embodiment according to FIG. 3, the capacitive crosstalk and the inductive crosstalk are symbolized as in FIG. 1 by equivalent circuit capacitances C, C', indicated in dashed lines, and, respectively, by magnetic field lines H, H' that partly encircle adjacent current flow lines identified by arrows.

The directions of the magnetic flux in the areas of the transducers or partial transducers, respectively, which depend on the respective direction of the current flow, are indicated by symbols "Ø" and "⊕", where, looked at in the plane of the drawing, the symbol "Ø" stands for the magnetic flux direction pointing upward and, correspondingly, the symbol "⊕" stands for the magnetic flux direction pointing downward.

In the Z-path filter according to FIG. 3, input and output transducers 10, 11, which are coupled to one another through corresponding reflectors 12, 13 inclined with respect to the main direction of propagation of the acoustic tracks, are disposed on mutually parallel acoustic tracks. However, the invention can also be used in the case of transversely coupled resonator ("TCR") filters in which the surface wave is transmitted into the adjacent tracks not through inclined reflectors but directly by acoustic coupling.

In the filter according to FIG. 3, both transducers, the pads of which are designated by 14, 15 and, respectively, 16, 17, 18, are divided into partial transducers a, a' and, respectively, b, b', longitudinally, i.e., seen in the direction of the main direction of propagation of the surface waves, and their pads 14, 15 and, respectively, 16, 17, 18 are routed such that the polarity of the electrical drive is transposed in one of the partial transducers. Thus, current flow loops of different orientation of the magnetic flux—see magnetic field lines H, H'—are obtained that lead to mutual cancellation of the inductive crosstalk contributions.

Finally, connecting the partial transducers a, a' in parallel and the partial transducers b, b' in series results in a capacitive half bridge for the pad capacitances and the transducer capacitances C, C' that is balanced with symmetric operation at the corresponding port or, respectively, input or output transducer.

In the configuration, the partial contributions of crosstalk per se essentially depend on the actual structure of the fingers of the transducers and on the pad structure, which must be taken into consideration when the transducers are split into the partial transducers. In contrast to the series connection, the parallel connection of the partial transducers provides more advantageous acoustic transducer impedances and, additionally, lower pad impedances and, thus, lower losses. The series circuit, in contrast, is distinguished by requiring less space and simpler pad routing.

Figure 4:
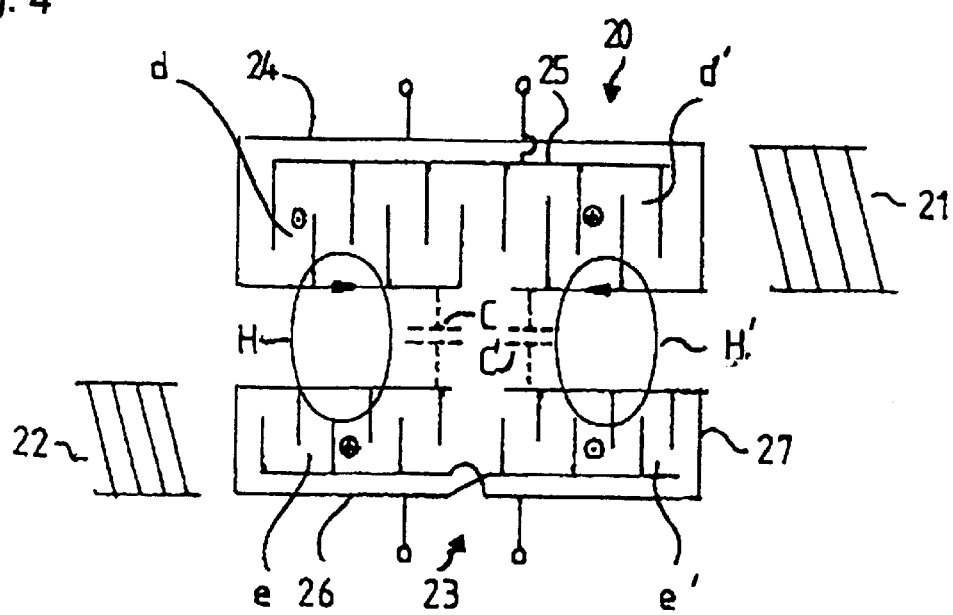
FIG. 4 is a schematic circuit diagram of another illustrative embodiment of a filter of the type according to FIG. 3.

In the Z-path filter according to FIG. 4, the input transducer 20 is respectively split longitudinally into partial transducers d, d', and the output transducer 23 coupled thereto through reflectors 21, 22 is split into partial transducers e, e'. Instead of mirroring, one partial transducer can be advantageously displaced with respect to the other partial transducer by an odd-numbered multiple of the half wavelength of the surface acoustic wave.

The pads 24, 25 and 26, 27 are in turn routed such that the polarity of the electrical drive is transposed in one of the partial transducers. Thus, different magnetic flux directions H, H' are obtained that lead to compensation of the induced crosstalk contributions.

In the illustrative embodiment of FIG. 4, both pairs of partial transducers are connected in parallel. The capacitive half bridge for the pad and transducer capacitances C, C' created in this manner is balanced again with symmetric operation at port 23.

Figure 5:
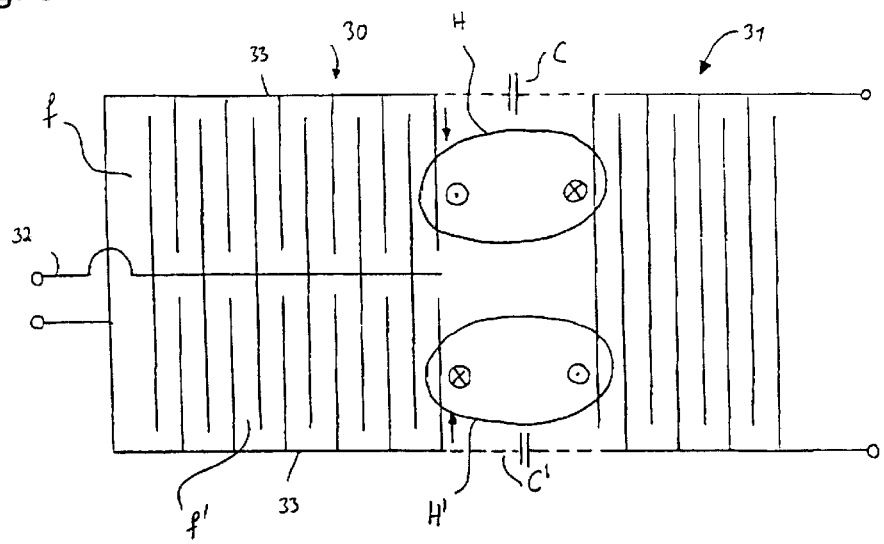
FIG. 5 is a schematic circuit diagram of an in-line filter according to the invention.

In the case of the in-line filter according to FIG. 5, i.e., a filter having input and output transducers 30 and 31, respectively, disposed on the same acoustic track, only one of the two transducers, namely, the input transducer 30, is transversely divided into partial transducers f, f'.

The partial transducer and the routing of the pads 32, 33 again produce a balancing of the crosstalk capacitances C, C' in the sense already explained above, and a compensation of the inductive crosstalk contributions.

Figure 6:
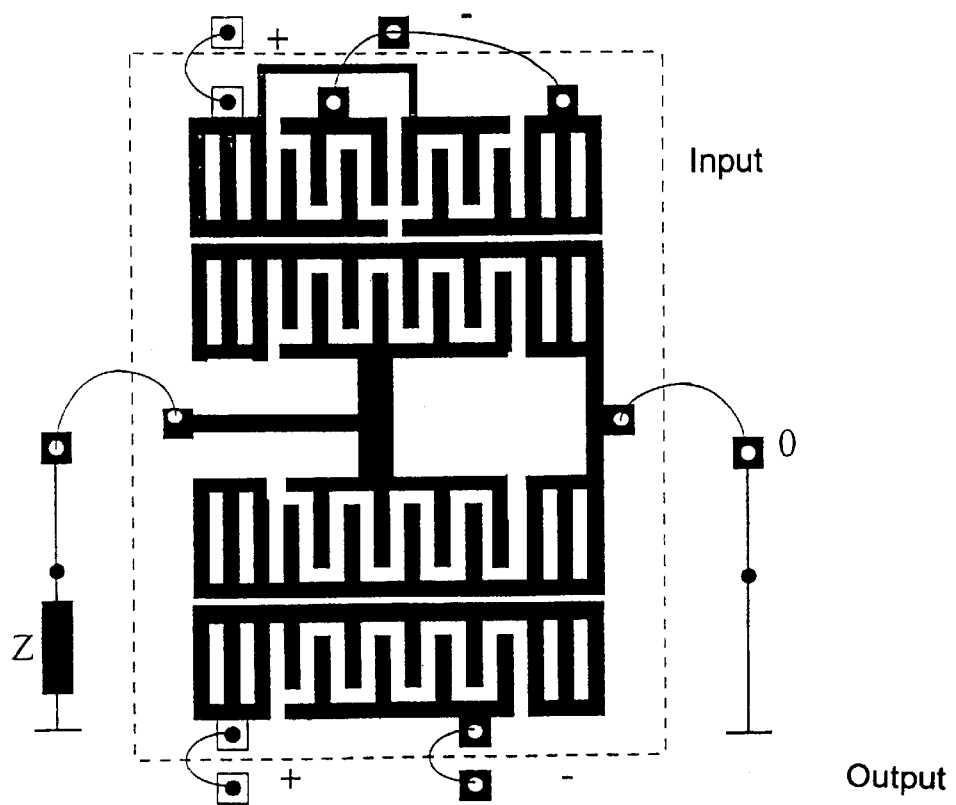
FIG. 6 is a schematic circuit diagram of a higher-order filter according to the invention building on the partial structures of FIG. 2 with compensated capacitive coupling.

FIG. 6 illustrates how the transducers according to the invention (e.g., according to FIG. 2) can be cascaded to form a higher-order filter. Input and output ends of the filter are configured as in FIG. 2. Coupling between the partial structures takes place purely electrically through the two center transducers operated asymmetrically. The impedance Z connected to the two center transducers is used for tuning the transfer characteristic of the overall filter. Splitting the input end into parallel-connected partial transducers compensates the capacitive crosstalk. The reactive capacitance does not lead to crosstalk since the center power rail is connected to ground.

If further filters operated asymmetrically at the input and output end are inserted into the structure according to FIGS. 2 or 6 and possibly terminated to ground by suitable impedances, filters according to the invention and of even higher order are obtained.

Figure 7:
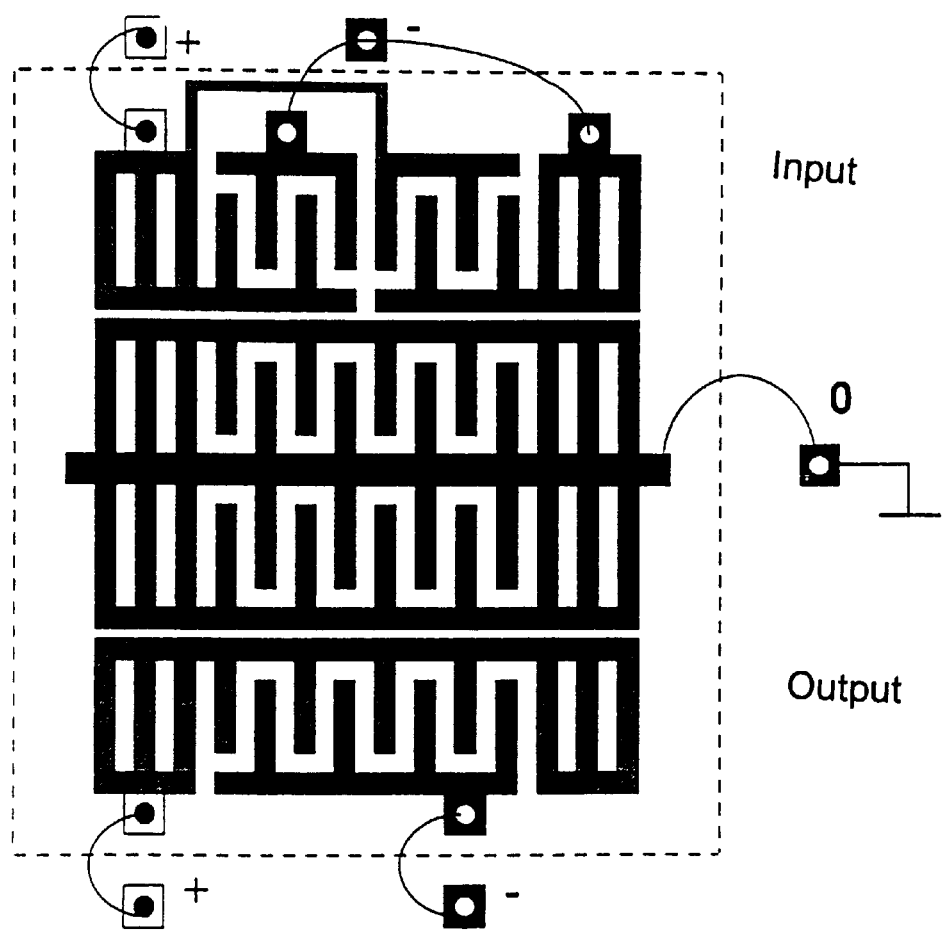
FIG. 7 is a schematic circuit diagram of a higher-order filter according to the invention having acoustically coupled tracks and compensated capacitive coupling.

FIG. 7 shows a filter according to the invention in which all tracks are coupled acoustically and not electrically. Here, too, adding additional resonator tracks can increase the order of the filter.

The invention is not restricted to the above illustrative embodiments, Various or arbitrary combinations of longitudinal/transverse transducer splitting, parallel/series connection of the partial transducers and combinations of acoustic in-line/transverse coupling are possible.

We claim:

1. A surface acoustic wave filter that can be operated symmetrically, comprising:

an input IDT transducer;

an output IDT transducer;

at least one of said IDT transducers being electromagnetically coupled and split into partial transducers, said IDT transducers having electrical connection pads and ports, at least one pair of said partial transducers connected in parallel, said partial transducers and said electrical connection pads disposed to make, in the case of symmetric operation, crosstalk capacitances between adjacent ones of said pads and said IDT transducers approximately equal in amount at a corresponding one of said ports and at voltages of opposite polarity for balancing the crosstalk capacitances;

a first magnetic coupling being disposed between said at least one pair of said partial transducers connected in parallel and having a first direction; and a second magnetic coupling being disposed between an adjacent pair of said partial transducers, having a second direction opposing the first direction, and making a total induced magnetic flux equal to zero for said electromagnetically coupled IDT transducers.

2. The surface acoustic wave filter according to claim 1, wherein a pad of said pads routing in one of two of said partial transducers is selected to transpose a polarity of an electrical drive.

3. The surface acoustic wave filter according to claim 1, wherein at least one of said input and output transducers is split transversely into said partial transducers.

4. The surface acoustic wave filter according to claim 1, wherein at least one of said input and output transducers is split longitudinally into said partial transducers.

5. The surface acoustic wave filter according to claim 4, wherein at least one of said input and output transducers is split transversely into said partial transducers.

6. The surface acoustic wave filter according to claim 1, wherein said partial transducers of said input and output transducers are connected in parallel.

7. The surface acoustic wave filter according to claim 1, wherein said partial transducers of said input and output transducers are connected differently.

8. The surface acoustic wave filter according to claim 1, wherein one of said partial transducers of one of said IDT transducers is displaced with respect to another one of said partial transducers of said one of said IDT transducers by an odd-numbered multiple of a half wavelength of a surface acoustic wave.

9. The surface acoustic wave filter according to claim 1, wherein one of two of said partial transducers is mirrored parallel to a direction of acoustic propagation.

10. A surface acoustic wave filter that can be operated symmetrically, comprising:

an input IDT transducer;

an output IDT transducer;

said input IDT transducer and said output IDT transducer being electromagnetically coupled and split into partial transducers;

said IDT transducers having electrical connection pads and ports;

at least one pair of said partial transducers being connected in parallel;

said partial transducers and said electrical connection pads being disposed to make, in the case of symmetric operation, crosstalk capacitances between adjacent ones of said pads and said IDT transducers approximately equal in amount at a corresponding one of said ports and at voltages of opposite polarity for balancing the crosstalk capacitances; and at least one of said input and output IDT transducers being split transversely into said partial transducers.

11. The surface acoustic wave filter according to claim 10, wherein one of two of said partial transducers is mirrored parallel to a direction of acoustic propagation.

12. The surface acoustic wave filter according to claim 10, wherein one of said partial transducers of one of said IDT transducers is displaced with respect to another one of said partial transducers of said one of said IDT transducers by an odd-numbered multiple of a half wavelength of a surface acoustic wave.

13. The surface acoustic wave filter according to claim 10, wherein said partial transducers are connected in parallel.

14. The surface acoustic wave filter according to claim 10, wherein at least one of said partial transducers is connected in parallel and at least another one of said partial transducers is connected in series.

15. The surface acoustic wave filter according to claim 10, wherein the other of said input and output IDT transducers, which is not split transversely, is split longitudinally into said partial transducers.

16. The surface acoustic wave filter according to claim 10, wherein said partial transducers of said input and output transducers are connected differently.

17. A surface acoustic wave filter that can be operated symmetrically, comprising:
an input IDT transducer;
an output IDT transducer;
said input IDT transducer and said output IDT transducer being electromagnetically coupled and split into pairs of partial transducers;
said IDT transducers having electrical connection pads and ports;
one of said pairs of said partial transducers being connected in parallel and the other of said pairs of said partial transducers being connected in series; and
said partial transducers and said electrical connection pads disposed to make, in the case of symmetric operation, crosstalk capacitances between adjacent ones of said pads and said IDT transducers approximately equal in amount at a corresponding one of said ports and at voltages of opposite polarity for balancing the crosstalk capacitances.

18. The surface acoustic wave filter according to claim 17, wherein at least one of said input and output transducers is split longitudinally into said partial transducers.

19. The surface acoustic wave filter according to claim 18, wherein at least one of said input and output transducers is split transversely into said partial transducers.

20. The surface acoustic wave filter according to claim 17, wherein at least one of said input and output transducers is split transversely into said partial transducers.

21. The surface acoustic wave filter according to claim 17, wherein one of two of said partial transducers is mirrored parallel to a direction of acoustic propagation.

22. The surface acoustic wave filter according to claim 17, wherein one of said partial transducers of one of said IDT transducers is displaced with respect to another one of said partial transducers of said one of said IDT transducers by an odd-numbered multiple of a half wavelength of a surface acoustic wave.

* * * * *